US007280415B2

(12) United States Patent
Hwang et al.

(10) Patent No.: US 7,280,415 B2
(45) Date of Patent: Oct. 9, 2007

(54) FLASH MEMORY DEVICE AND METHOD OF REPAIRING DEFECTS AND TRIMMING VOLTAGES

(75) Inventors: Sang-Won Hwang, Gyeonggi-do (KR); Dong-Kyu Youn, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/380,749

(22) Filed: Apr. 28, 2006

(65) Prior Publication Data

US 2007/0033449 A1 Feb. 8, 2007

(30) Foreign Application Priority Data

Jul. 25, 2005 (KR) .................... 10-2005-0067478

(51) Int. Cl.
*G11C 7/00* (2006.01)
(52) U.S. Cl. ............................. 365/189.09; 365/189.11
(58) Field of Classification Search ......... 365/189.09, 365/189.11, 225.7, 226
See application file for complete search history.

(56) References Cited

U.S. PATENT DOCUMENTS 6,788,575 B2  9/2004  Kozakai et al.
6,965,520 B1*  11/2005  Seshadri et al. ............ 365/145
2005/0018483 A1*  1/2005  Imamiya et al. ........ 365/185.09
2005/0077923 A1*  4/2005  Kim et al. ................... 327/50
2006/0279442 A1*  12/2006  Kimura et al. .............. 341/121

FOREIGN PATENT DOCUMENTS

JP    2003-288791    10/2003
JP    2004-118407     4/2004
KR   2003-0058256     7/2003
KR   2003-0067520     8/2003

OTHER PUBLICATIONS

English language abstract of Korean Publication No. 2003-0058256.
English language abstract of Japanese Publication No. 2003-288791.
English language abstract of Japanese Publication No. 2004-118407.

* cited by examiner

*Primary Examiner*—Vu A. Le
(74) *Attorney, Agent, or Firm*—Marger Johnson & McCollom, P.C.

(57) ABSTRACT

A memory device includes a nonvolatile memory cell array including a plurality of memory cells with a portion of the memory cells to store fuse data, and a fuse register to store the fuse data from the memory cell array. An operation of the memory device is modified in response to the fuse register.

24 Claims, 5 Drawing Sheets

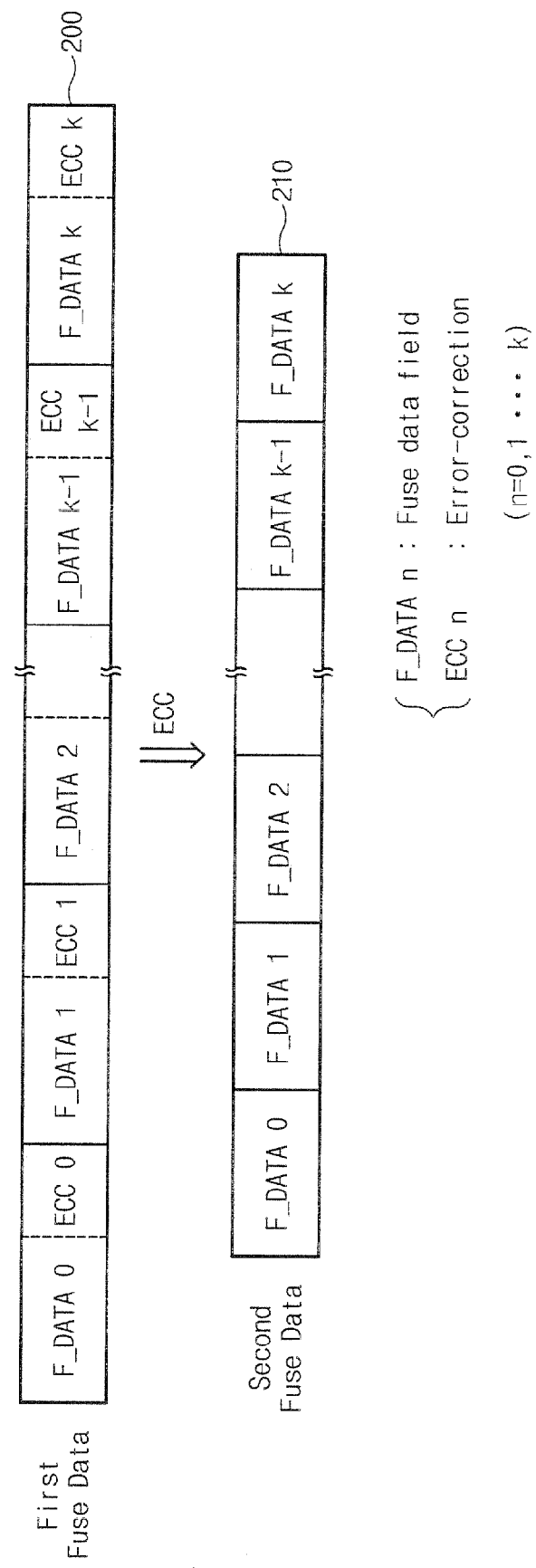

Fig. 3C

| First Fuse Data n-m+1 | First Fuse Data n-m+2 | ... | First Fuse Data n |
|---|---|---|---|
| ⋮ | ⋮ | | ⋮ |
| First Fuse Data m+1 | First Fuse Data m+2 | ... | First Fuse Data 2m |
| First Fuse Data 0 | First Fuse Data 1 | ... | First Fuse Data m |

(Cell Array above, labeled 10)

FLASH MEMORY DEVICE AND METHOD OF REPAIRING DEFECTS AND TRIMMING VOLTAGES

CROSS-REFERENCE TO RELATED APPLICATIONS

This U.S. non-provisional patent application claims priority under 35 U.S.C. § 119 of Korean Patent Application 2005-67478 filed on Jul. 25, 2005, the entire contents of which are hereby incorporated by reference.

BACKGROUND

The subject matter disclosed herein is concerned with semiconductor memory devices. In particular, the subject matter disclosed herein relates to technologies for repairing defective cells and trimming voltages in a flash memory device.

Improvements in semiconductor memory devices to increase performance include higher integration density, larger capacity, and increased sizes of chips. However, these improvements may impose particular requirements and may result in various problems. Such requirements and problems may include decreased product yields, narrower line widths, increased processing steps, more complicated fabrication techniques, and so forth. As a result, semiconductor memory devices are designed with spare memory cells (or redundant memory cells) to substitute for defective memory cells. Semiconductor memory devices usually include fuse boxes so that addresses of defective cells are substituted with the addresses of redundant memory cells. After the detection of defective cells by test operations, addresses of the defective cells are assigned to corresponding redundant cells through a programming process by cutting fuses in the fuse box. Although a given semiconductor memory chip may have defective cells, the chip may still be used as a good product by replacing the defective cells with redundant cells. However, if there are more defective cells than redundant cells, the semiconductor memory chip is defined as a failure, because it is impossible to repair all of the defective cells.

Furthermore, semiconductor memory devices may utilize internal power sources having various DC voltage levels. Those DC voltages are supplied by voltage generators embedded in the semiconductor memory devices. The levels of DC voltages are determined when designing the semiconductor memory devices. For the optimum memory operations, the reference voltages should to be supplied from the voltage generators at the designed voltage level. However, reference voltages generated in the memory devices during actual operation may not be equal with the designed levels due to various factors involved in manufacturing processes. When the difference between the designed and actual reference voltage is greater than a predetermined value, the difference may be corrected using a fuse box for trimming the DC voltage levels on the reference. An optimum DC voltage is properly selected by programming fuses of the fuse box connected to the internal voltage generator. In the fuse box, the fuses are selectively cut to select an optimum level among various available voltages.

However, there are problems associated with using a fuse box for repairing defective cells and trimming DC voltages. Additional processing steps are needed for the fuse programming operation in the fuse box. In addition, chip integration density is restricted due to the additional circuit area for the fuse box. Furthermore, it is difficult if not impossible to repair the semiconductor memory chip from progressive defects occurring after packaging of the chip or changes due to the operating environment of the chip.

SUMMARY

An embodiment includes a memory device including a nonvolatile memory cell array including a plurality of memory cells with a portion of the memory cells to store fuse data, and a fuse register to store the fuse data from the memory cell array. An operation of the memory device is modified in response to the fuse register.

Another embodiment includes a method for configuring a memory device including reading fuse data from a memory cell array, storing the fuse data in a fuse register, and mapping an address associated with a defective memory cell to an address associated with a redundant memory cell in response to the fuse data stored in the fuse register.

A further embodiment includes a method for configuring a memory device including reading fuse data from a memory cell array, storing the fuse data in a fuse register, and trimming an internal voltage in response to the fuse data stored in the fuse register.

BRIEF DESCRIPTION OF THE FIGURES

Non-limiting and non-exhaustive embodiments will be described with reference to the following figures, wherein like reference numerals refer to like parts throughout the various figures unless otherwise specified. In the figures:

FIG. 2 is a diagram illustrating an organization of fuse data by the invention;

FIGS. 3A, 3B, and 3C are diagrams illustrating the features of arranging fuse data on the cell array.

DETAILED DESCRIPTION

Embodiments will be described below in more detail with reference to the accompanying drawings. Embodiments may take different forms and should not be construed as limited to the embodiments set forth herein. Rather, these embodiments are provided so that this disclosure will be thorough and complete, and will fully convey the scope to those skilled in the art.

Hereinafter, embodiments will be described in conjunction with the accompanying drawings.

Figure 1:
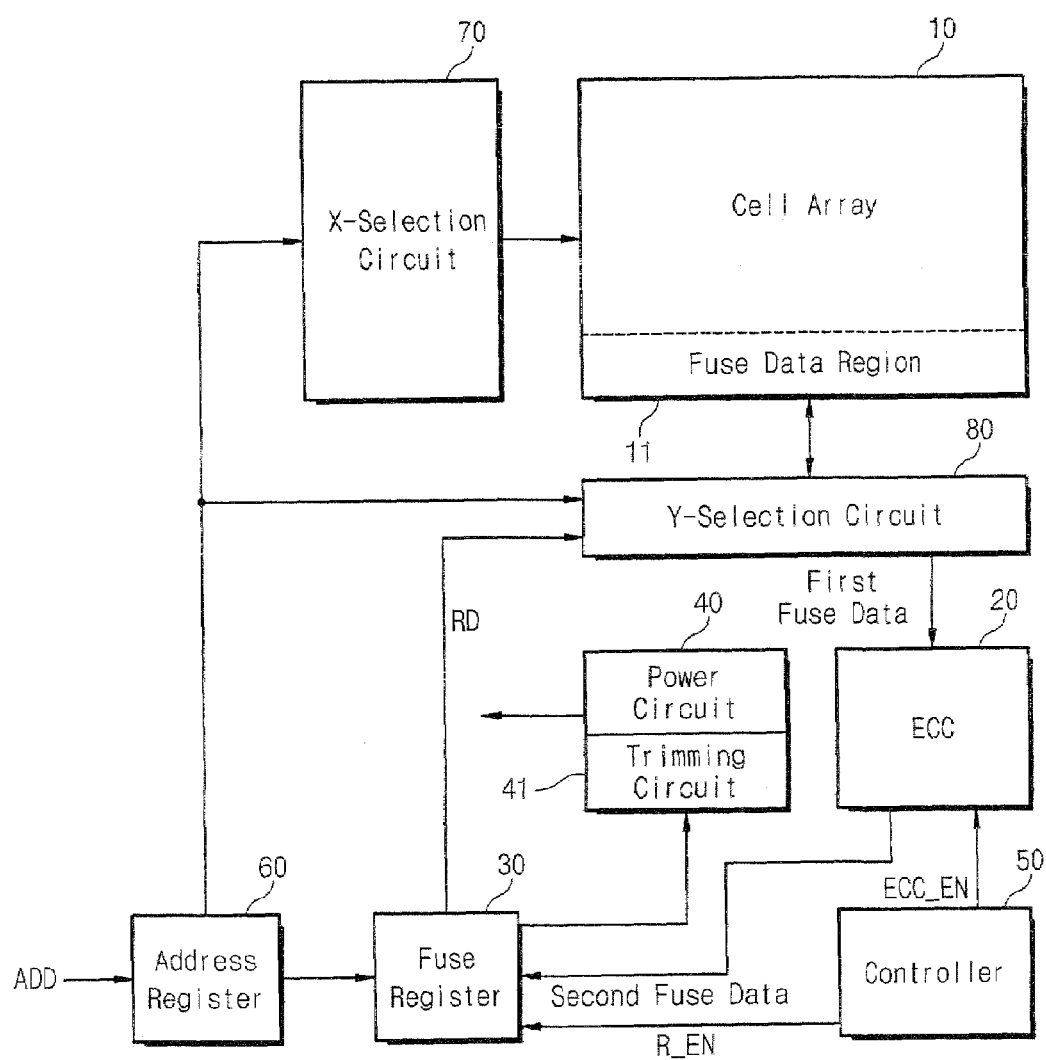
FIG. 1 is a block diagram of a flash memory device illustrating structures for repairing defects and trimming voltages according to an embodiment.

FIG. 1 is a block diagram of a flash memory device illustrating structures for repairing defects and trimming voltages according to an embodiment. Referring to FIG. 1, the flash memory device includes a cell array 10 to store fuse data, an error correction circuit 20 to correct errors of the fuse data stored in the cell array 10, a fuse register 30 to repair defective cells and trim internal voltages, a power circuit 40 to generate and supply the internal voltages, a controller 50 to regulate the operations of error correction for the fuse data, repair defective cells, and trim the internal voltages, an address register 60, an X-selection circuit 70, and a Y-selection circuit 80.

The cell array 10 may be a nonvolatile memory cell array including a region 11 that stores the fuse data (hereinafter, fuse data region 11). The fuse data are arranged by programming information about defective cells in specific locations in the cell array 10 and information about trimming conditions for the internal voltages. Such information may be obtained from testing the memory device at a wafer level during the manufacturing process. In this description, both the defective cell and trimming information may be commonly referred to as fuse data. Furthermore, fuse data stored in specific fields may be referred to as first fuse data. The first fuse data may include information about defective cells and trimming conditions, as well as error correction bits for the information within the fuse data. For instance, a parity bit to be used for correcting a 1-bit error is programmed in the fuse data region together with the defective-cell and trimming information. The parity bit of the fuse data will be described in detail with reference to FIG. 3. The first fuse data may be written into the specific fields of the cell array, or arranged in an independent cell array block exclusive to the fuse data. Such fuse data may be used to perform functions performed by a conventional fuse box. However, unlike the conventional fuse box, it may be modified when there are additional needs of repairing progressive defects or further trimming of internal voltage levels. The simple modification for the fuse data provides the benefits of repairing defects, similar to a fuse cutting operation.

The error correction circuit (ECC) 20 is provided to detect an error on the first fuse data read out from the cell array 10 and to correct the detected error. The error correction circuit 20 may use error correction codes capable of correcting more than 2 bit errors. However, the error correction circuit may detect and correct a 1-bit error (e.g., as in a parity detector), to reduce the effect on integration density of the memory device. If the error correction circuit is configured to detect and correct 2 or more bit errors, the area occupied by the error correction circuit in the chip may detrimentally affect the integration density of the memory device. Furthermore, to increase the reliability of the fuse data the fuse data patterns may be programmed in multiple addresses of the memory cell array 10. Thus, a fuse data having only no errors or a 1-bit error may be corrected and used, even though there are more than 2 bit errors in the fuse data as stored in other addresses.

The fuse register 30 stores second fuse data output from the error correction circuit 20, having data segments for defective-cell repair data and voltage-trimming data. The defective-cell repair data includes address information about defective cells (i.e., defective-cell address detected during manufacturing processes), and address information about redundant cells (i.e., redundant-cell address) to substitute for the defective cells. The voltage-trimming data includes switching information for optimum voltage-trimming conditions obtained by the test operation at the wafer level.

The fuse register 30 compares an input address with the address information. If the input address corresponds to the address of a defective cell, the fuse register 30 generates a redundant signal RD to the Y-selection circuit 80 in order to substitute the defective-cell address with the redundant-cell address. For this operation, the fuse register 30 includes an address comparator. Furthermore, the fuse register 30 transfers trimming data to a trimming circuit 41 of the power circuit 40 so as to trim internal DC voltages.

The power circuit 40 is used to generate internal DC (or constant) voltages used in the flash memory device. The power circuit 40 may include a reference voltage generator to provide reference levels for a program voltage, an erasing voltage, a verifying voltage, and a read voltage, and a charge pump circuit to provide incremental step programming pulses (ISPP). The voltages for programming the cell array are supplied from the power circuit 40 and then selectively transferred to wordlines through the X-selection circuit 70. Thus, the power circuit 40 supplies various internal voltages for internal operations to various components of the flash memory device.

A conventional trimming circuit generally includes resistors connected in series, and corresponding fuses coupled in parallel with the resistors. Thus, a reference level of the internal voltages is adjusted by selectively cutting the fuses. However, the trimming circuit 41 has transistor switches instead of the conventional fuses. The transistor switches are turned on or off in compliance with the trimming data stored in the fuse register 30. Thus, there is no need to conduct a fuse cutting process. Furthermore, it is possible to trim the internal voltages by modifying the fuse data even when progressive defects are caused after the packaging process.

The controller 50 controls the fuse register 30 and the error correction circuit 20. In response, the error correction circuit 20 reads the fuse data and corrects errors to provide error-corrected fuse data input to the fuse register 30. The error correction may occur at a booting or a reset stage. And, the controller 50 enables the fuse register 30 to repair defective cells and to trim internal voltages.

The address register 60 is provided to temporarily store input addresses ADD supplied from an external source (e.g., a host system such as CPU). The address stored in the address register 60 is output to the fuse register 30, and then compared with any defective-cell address designated by the fuse data. If the input address ADD matches a defective-cell address stored in the fuse register 30, the fuse register 30 enables the Y-selection circuit 80 to use a redundant-cell address corresponding to the defective cell address. If the current input address ADD does not correspond to a defective cell, it is supplied to the X-selection circuit 70 and the Y-selection circuit 80 along a normal input route.

The X-selection circuit 70 designates a wordline of the cell array 10 in response to an address, and transfers a voltage to the designated (or selected) wordline from the power circuit 40. While this embodiment is illustrated as employing a column redundant scheme in a flash memory device as is general, the X-selection circuit 70 may be configured to receive the redundant signal RD from the fuse register 30 in a row redundant scheme. Furthermore, both a row redundant and column redundant scheme may be used simultaneously.

The Y-selection circuit 80 designates a bitline corresponding to the input address. Specifically, the Y-selection circuit 80 makes a column address become a column address associated with a designated redundant column, in response to the redundant signal RD, when the column address initially addresses a defective cell.

As described above, defective cells may be repaired and internal voltages may be trimmed in a flash memory device without the conventional fuse box. The fuse register 30 and the fuse data stored in the cell array 10 provide means for enabling the function of repairing defective cells and trimming internal voltages without conducting the conventional fuse cutout process. Such repairing and trimming operations are able to be performed, without being confined to a particular stage of manufacturing processes. For example, the operations may occur after a packaging process. In addition, error correction of the fuse data may be performed by the error correction circuit 20 to correct progressive defects due to deterioration and voltage stress.

FIG. 2 is a diagram illustrating an organization of the fuse data. Referring to FIG. 2, the fuse data is divided into the first fuse data 200 and the second fuse data 210.

The fuse data before detecting and correcting an error includes fuse data fields, F_DATA0, F_DATA1, F_DATA2, . . . , and F_DATAk (F_DATA0~F_DATAk), which contain cell-repair information as the address information about defective and redundant cells, trimming information, and error-correction coding data fields, ECC0, ECC1, ECC2, . . . , and ECCk (ECC0~ECCk), corresponding to the fuse data fields F_DATA0~F_DATAk. The error-correction coding fields ECC0~ECCk are used for the 1-bit error detection and correction of the respective fuse data fields F_DATA0~F_DATAk.

The error detection and correction for the first fuse data 200 enhances the reliability of the fuse data. The error correction codes (i.e., the error-correction coding fields) generally usable in memory devices include Hamming codes proposed by R. W. Hamming. Error correction using a Hamming code is carried out by reading out the first fuse data 200 from the cell array 10 and generating check bits from the fuse data fields F_DATA0~F_DATAk of the first fuse data 200. The check bits are compared each with the error-correction coding fields ECC0~ECCk, to find the presence of errors in the first fuse data 200. If the check bit agrees with the error correction code, it means there is no error. Then, the corresponding fuse data field is transferred to the fuse register 30. If there is a 1-bit error, the check bits are not identical with the error correction codes. The Hamming codes are used to conduct the error correction by way of selecting a bit having an error and using the complement of the erroneous bit.

Although multi-bit error correction for correcting two or more bit errors is available, it is less preferred because of its increased complexity and accompanying limit on the integration density of the memory device. The redundant programming of the first fuse data 200 in to different addresses may be sufficient to assure the reliability of the repair information with 1-bit error correction. Thus, data with two or more bit errors is disregarded, while fuse data with a 1-bit error is put into the error correction sequence to use the repair data (i.e., the fuse data). Thus, the second fuse data 210 includes the fuse data fields F-DATAk (k=n) with any errors corrected. The second fuse data 210 are transferred to the fuse register 30.

The error correction of the fuse data 200 enables the second fuse data 30 to be read out reliably in spite of progressive defects in the programmed cell array and errors arising from a read operation. Furthermore, a simple 1-bit error correction circuit is relatively easy to implement in the flash memory device.

Figure 3A:
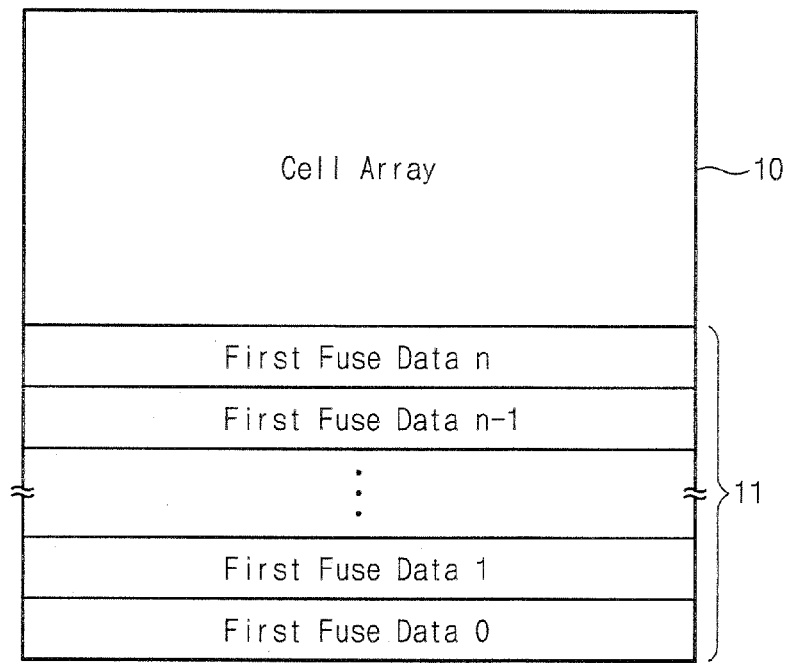
Figure 3B:
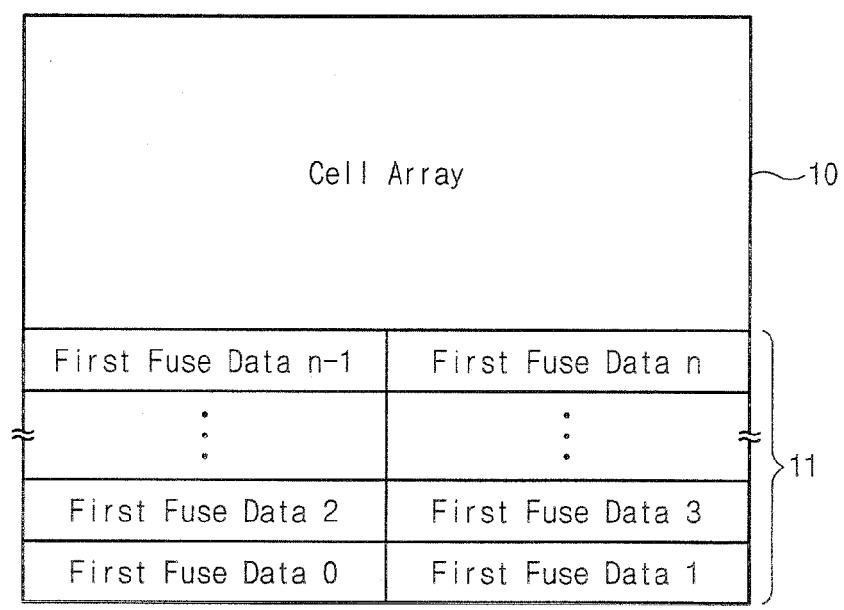

FIGS. 3A, 3B, and 3C are diagrams illustrating the features of positional arrangement of the first fuse data 200 programmed on the cell array 10. Typical defects in the cell array 10 tend to be generated in a uniform direction. An appropriate arrangement of the first fuse data 200 contributes the reliability of fuse data. The first fuse data 200 is stored in multiple sections, from 0 to n, in the cell array 10. It is preferable for the total number of the first fuse data sections, from 0 to n, to be set to enough to ensure the reliability of fuse data.

First, FIG. 3A shows the case that each section of the first fuse data 200 occupies one of the row addresses on the cell array 10. The section of the first fuse data may be the same size as or larger than a unit page. The arrangement of the first fuse data on the cell array 10, as shown in FIG. 3A, is provided to preserve the first fuse data sections even when there are defects along a row direction in one or two sections of the first fuse data due.

Second, FIG. 3B shows the case that the sections of the first fuse data 200 are arranged to resist defects along the column direction. In this case, even though the odd numbered first fuse data sections may be disabled due to a defect on a column, it is possible to retain the reliability of fuse data since the even sections are present without defects. Although only two columns are illustrated in FIG. 3B, one of ordinary skill in the art will understand that any number of columns may be used.

Third, FIG. 3C further divides the fuse data region 11 of the first fuse data into sections along both rows and columns, providing an arrangement of the first fuse data 200 to enhance the reliability of fuse data to defective cells arising along rows or columns. In this case, even though there may be many across in the fuse data region 11 of the cell array 10, it may still be possible to completely repair a defective cell if there is a first fuse data 200 with no more than 1-bit error among n+1 sections of the first fuse data 200.

Thus, programming the first fuse data 200 in multiple locations on the cell array 10, as described above, increases the reliability of the first fuse data 200 provided to the error correction circuit 20. In addition, the sectional arrangement of the first fuse data 200 stored in the cell array 10 aids in resisting errors in the fuse data due to failures within the fuse region 11 of the cell array 10.

Figure 4:
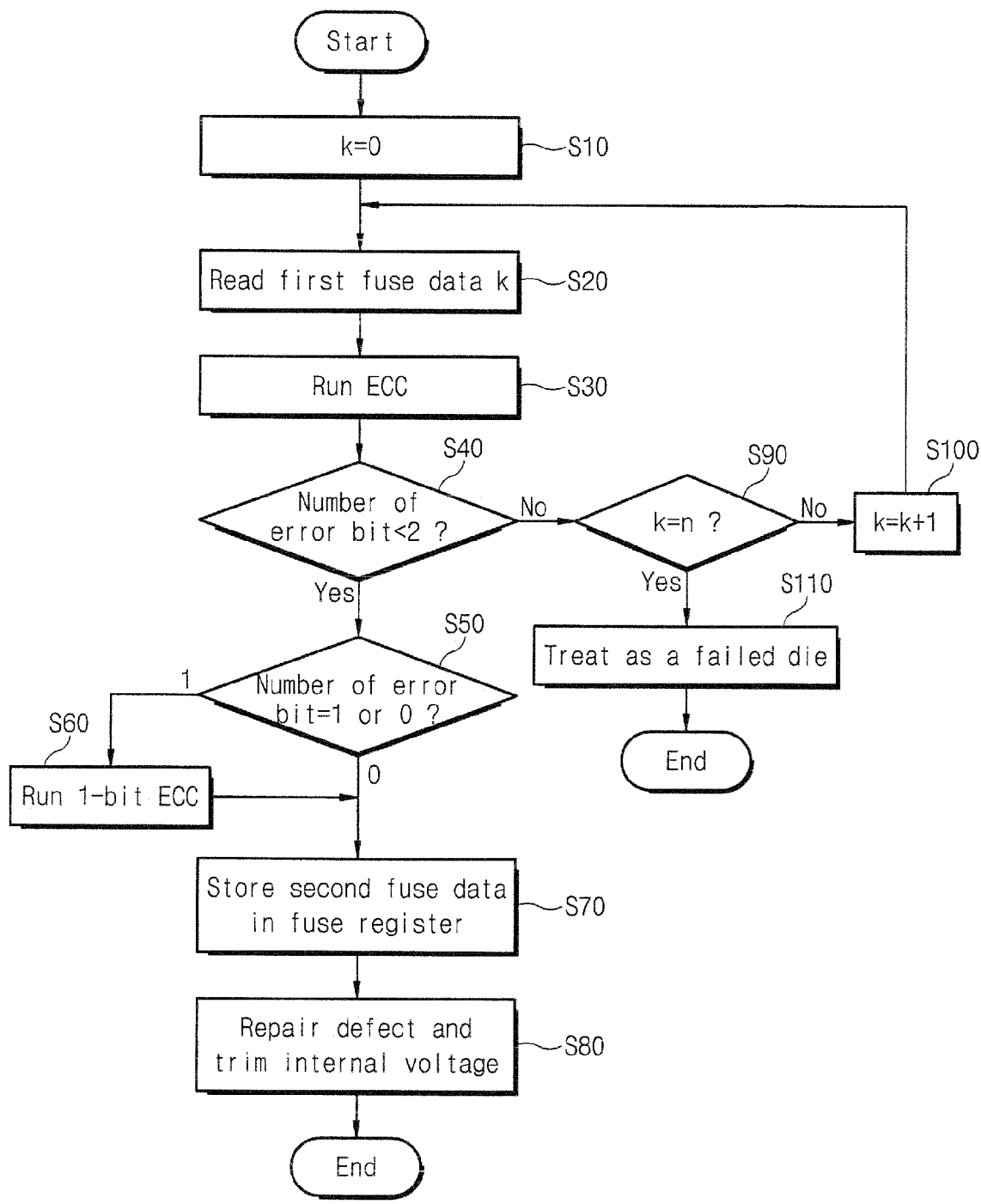
FIG. 4 is a flow chart showing the procedure of repairing defective cells and trimming voltages in accordance with the invention.

FIG. 4 is a flow chart showing the procedure of repairing defective cells and trimming internal voltages with using the fuse data read out from the cell array 10. The operations of reading out the fuse data, correcting errors of the fuse data, repairing defective cells by the fuse data, and trimming the internal voltages will be described with reference to the accompanying figures.

The operations of repairing defective cells and trimming the internal voltages may be performed at various times, including while testing or booting the flash memory device. The controller 50 initializes an error correction counter k in S10. The first fuse data corresponding to the initialized error correction counter k value is read out into the error correction circuit 20 from the cell array 10 in S20. Error-checking bits for the fuse data fields F_DATA0~F_DATAk of the first fuse data input to the error correction circuit 20 are detected and compared with the bit values of the error-correction coding fields ECC0~ECCk to find the number and locations of error bits in S30. From the error-detecting operation, it counts the number of bit errors generated therein. In S40, if the number of error bits in the first fuse data 200 is less than 2, the procedure turns to S50. Otherwise, in S40, if the number of error bits is 2 or more, the procedure turns to step S90. In S50, if the number of error bits is 1, the flow proceeds to S60. But, if the first fuse data 200 has no errors, the flow proceeds to S70. In S60, a 1 bit error is corrected by a 1 bit error-correcting operation. Thus, the first fuse data 200 is converted into the second fuse data 210. In S70, the second fuse data 210 is input to the fuse register 30. On basis of the second fuse data 210 stored in the fuse register 30, internal voltages are trimmed and defective cells are repaired by the trimming circuit 41 and the redundant circuitry in S80.

Returning to S40, when the number of bit errors is 2 or more in S40, the flow proceeds to S90. In S90, it is determined if there are duplicate copies of the first fuse data 200. If the last duplicate copy of the first fuse data 200 stored in the cell array 10 has 2 or more bit errors, the testing and repairing operations are terminated in S110. The flash memory device is labeled as a bad product or a failure, because it is unable to perform the error correction. But, in the step S90, if there is still a duplicate copy of the first fuse data 200 to be read (i.e., k≠n), k is increased by 1 and the flow returns to S20 to fetch the kth first fuse data 200 from the cell array 10.

While operations of repairing defective cells and trimming the internal voltages are generally used in a test mode, it may be used every time the memory device is booted, including when the device is installed for its intended use. Furthermore, the first fuse data 200 is repairable by updating itself with information on defects discovered at a later time in the cell array 10. In addition, it is able to adjust the internal voltages to optimum values by updating the trimming information of the first fuse data, even to adjust for variations of the internal voltages due to deterioration caused from long-term use and thermal exposure.

In addition, according to the method of repairing defective cells and trimming internal voltages, it is possible to reduce a time for repairing defects because there is no need to conduct fuse trimming operations.

Furthermore, product yields are enhanced because the repairing and trimming operations are available for later discovered defects, which may be detected even after a packaging process and after the device is installed and operating in its intended environment.

Moreover, it is possible to increase the reliability of fuse data through the error-correcting operation, reducing costs by the reducing processing time and increasing product yields.

Although, among others, replacing defective memory cells with redundant memory cells and trimming voltages in response to fuse data stored in the memory cells has been described, one of ordinary skill in the art will understand that other optimizations commonly made by trimming fuses may be adjusted in response to the fuse data. For example, delay times within the memory device may be adjusted in response to the fuse data.

In addition, although defective cells and redundant cells have been described in separate groups, one of ordinary skill in the art will understand that a redundant cell may become defective at some point in time. As a result, the defective redundant cell may be treated as other defective cells and replaced with another redundant cell.

While particular embodiments have been described, it will be understood by those skilled in the art that various other modifications may be made, and equivalents may be substituted, without departing from the spirit and scope of the following claims.

What is claimed is:

1. A memory device comprising:
a nonvolatile memory cell array including a plurality of memory cells, a portion of the memory cells to store fuse data; and
a fuse register to store the fuse data from the memory cell array;
wherein an operation of the memory device is modified in response to the fuse register.

2. The memory device of claim 1, further comprising a column selection circuit coupled to the memory cells, and operable to map an address corresponding to one of the memory cells to a redundant address corresponding to a redundant memory cell of the memory cells in response to the fuse data stored in the fuse register.

3. The memory device of claim 1, further comprising a wordline selection circuit coupled to the memory cells, and operable to map an address corresponding to one of the memory cells to a redundant address corresponding to a redundant memory cell of the memory cells in response to the fuse data stored in the fuse register.

4. The memory device of claim 1, further comprising a power circuit to generate an internal voltage for the memory device, the internal voltage set in response to the fuse data in the fuse register.

5. The memory device of claim 1, further comprising an error correction circuit to read the fuse data from the memory cell array and provide error corrected fuse data to the fuse register.

6. The memory device of claim 5, the error correction circuit further to correct a one bit error in the fuse data.

7. The memory device of claim 5, the error correction circuit further to read a redundant copy of the fuse data from the memory cell array if the fuse data read from the memory cell array had more that one bit error.

8. The memory device of claim 1, the memory cell array further to store error correction data for the fuse data with the fuse data.

9. The memory device of claim 1, the memory cell array further to store at least one redundant copy of the fuse data.

10. A method for configuring a memory device, comprising:
reading fuse data from a memory cell array;
storing the fuse data in a fuse register; and
mapping an address associated with a defective memory cell to an address associated with a redundant memory cell in response to the fuse data stored in the fuse register.

11. The method of claim 10, further comprising reading error correction data associated with the fuse data in the fuse register.

12. The method of claim 10, further comprising correcting errors in the fuse data before storing the fuse data.

13. The method of claim 12, wherein correcting errors in the fuse data further comprises correcting a one bit error in the fuse data.

14. The method of claim 12, wherein correcting errors in the fuse data further comprises reading a redundant copy of the fuse data from the memory cell.

15. The method of claim 14, wherein reading the fuse data further comprises:
searching for a copy of the fuse data having less than two bit errors from among a plurality of redundant copies of the fuse data stored in the memory cell array;
if the copy of the fuse data with less than two bit errors is found, providing the copy of the fuse data as the read fuse data; and
if the copy of the fuse data with less than two bit errors is not found, determining that the memory device is defective.

16. The method of claim 10, further comprising:
identifying an additional defective memory cell of the memory cell array; and
updating the fuse data with information on the additional defective memory cell.

17. The method of claim 10, further comprising:
testing the memory device to identify defective memory cells; and
storing the fuse data in the memory cell array with information on the identified defective memory cells.

18. The method of claim 17, wherein storing the fuse data in the memory cell array further comprises storing multiple copies of the fuse data in the memory cell array.

19. The method of claim 18, wherein storing multiple copies of the fuse data further comprises storing multiple copies of the fuse data in at least one of multiple rows and multiple columns of the memory cell array.

20. The method of claim 10, further comprising trimming an internal voltage in response to the fuse data stored in the fuse register.

21. A method for configuring a memory device, comprising:
   reading fuse data from a memory cell array;
   storing the fuse data in a fuse register; and
   trimming an internal voltage in response to the fuse data stored in the fuse register.

22. The method of claim 21, further comprising correcting errors in the fuse data before storing the fuse data.

23. The method of claim 22, wherein correcting errors in the fuse data further comprises reading a redundant copy of the fuse data from the memory cell.

24. The method of claim 21, wherein trimming the internal voltage further comprises trimming the internal voltage to an optimum value.

* * * * *

UNITED STATES PATENT AND TRADEMARK OFFICE
CERTIFICATE OF CORRECTION

PATENT NO. : 7,280,415 B2  Page 1 of 1
APPLICATION NO. : 11/380749
DATED : October 9, 2007
INVENTOR(S) : Sang-Won Hwang et al.

It is certified that error appears in the above-identified patent and that said Letters Patent is hereby corrected as shown below:

Column 6, line 18, the words "among n+1" should read -- among the n+1 --.

Signed and Sealed this

Twenty-third Day of September, 2008

JON W. DUDAS
*Director of the United States Patent and Trademark Office*